United States Patent
Eichelberg (12)

(10) Patent No.: US 9,332,670 B1
(45) Date of Patent: May 3, 2016

(54) DATA CENTER MODULE WITH LEVELING PAD

(71) Applicant: Amazon Technologies, Inc., Reno, NV (US)

(72) Inventor: John William Eichelberg, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 568 days.

(21) Appl. No.: 13/682,641

(22) Filed: Nov. 20, 2012

(51) Int. Cl.
*H05K 7/14* (2006.01)
*F16M 9/00* (2006.01)
*G06F 1/16* (2006.01)

(52) U.S. Cl.
CPC .............. *H05K 7/1495* (2013.01); *F16M 9/00* (2013.01); *G06F 1/16* (2013.01)

(58) Field of Classification Search
CPC ........... F16F 7/087; F16F 7/082; F16F 7/085; F16F 7/00; F16F 7/01; F16F 7/12; F16F 15/04; E04B 1/98; H05K 7/1495; H05K 7/20454; H05K 7/186; F16M 9/00; F16M 7/00
USPC ............ 52/167.1, 167.7, 167.8, 126.1, 126.5, 52/126.6, 126.7, 403.1; 248/611, 634, 248/632, 633, 560, 637, 638, 639, 676, 678, 248/346.05; 267/140, 136, 141, 153; 472/92
See application file for complete search history.

(56) References Cited

U.S. PATENT DOCUMENTS

| | | | | |
|---|---|---|---|---|
| 1,974,158 A * | 9/1934 | Okenfuss | ....................... | 248/651 |
| 3,090,331 A * | 5/1963 | McCann | .................... | 108/57.12 |
| 3,311,331 A * | 3/1967 | Steimen | ........................ | 248/633 |
| 3,852,931 A * | 12/1974 | Morse et al. | ................. | 52/293.3 |
| 4,066,234 A * | 1/1978 | Nycum | ........................ | 248/558 |
| 4,705,257 A * | 11/1987 | Leo et al. | ....................... | 248/611 |
| 4,727,695 A * | 3/1988 | Kemeny | ....................... | 52/167.8 |
| 5,653,070 A | 8/1997 | Seguin | | |
| 5,738,330 A * | 4/1998 | Folkens et al. | ................ | 248/632 |
| 5,924,661 A * | 7/1999 | Chernack | .................... | 248/188.2 |
| 6,155,527 A * | 12/2000 | Muyskens | ................ | 248/346.03 |
| 6,427,965 B1 * | 8/2002 | McCracken | .................. | 248/633 |
| 6,981,685 B1 * | 1/2006 | McHugh et al. | .............. | 248/678 |
| 7,300,032 B2 * | 11/2007 | Williams et al. | .............. | 248/633 |

(Continued)

FOREIGN PATENT DOCUMENTS

CN 102006757 A * 4/2011
CN 102477748 A * 5/2012

OTHER PUBLICATIONS

U.S. Appl. No. 13/779,411, filed Feb. 27, 2013, Brock Robert Gardner.

(Continued)

*Primary Examiner* — Robert Canfield
*Assistant Examiner* — Babajide Demuren
(74) *Attorney, Agent, or Firm* — Robert C. Kowert; Meyertons, Hood, Kivlin, Kowert & Goetzel, P.C.

(57) ABSTRACT

A system includes a floor, one or more modules, one or more pads between a base of the modules and the floor, and one or more pad compression mechanisms. The data center modules include more electrical systems coupled to the module base. The pads compress to conform to variations in the surface of the floor. The pad compression mechanisms are operable by a user to compress the pads between the modules and the floor.

28 Claims, 4 Drawing Sheets

(56) References Cited

U.S. PATENT DOCUMENTS

| | | | |
|---|---|---|---|
| 7,509,782 B2* | 3/2009 | Colosimo et al. | 52/792.1 |
| 8,240,490 B2 | 8/2012 | Malekmadani | |
| 8,266,921 B2 | 9/2012 | Tashiro | |
| 8,613,364 B2* | 12/2013 | Bailey et al. | 211/26 |
| 2003/0106274 A1* | 6/2003 | Sievers | 52/292 |
| 2004/0244310 A1 | 12/2004 | Blumberg | |
| 2005/0100253 A1* | 5/2005 | Chang et al. | 384/36 |
| 2006/0091229 A1* | 5/2006 | Bash et al. | 236/49.3 |
| 2007/0261323 A1* | 11/2007 | Hubbard et al. | 52/167.6 |
| 2009/0000243 A1 | 1/2009 | Blumberg | |
| 2009/0000526 A1* | 1/2009 | Looker | 108/57.12 |
| 2010/0064714 A1* | 3/2010 | Tashiro | 62/259.2 |
| 2010/0154687 A1 | 6/2010 | Blumberg | |
| 2011/0222800 A1 | 9/2011 | Hubbard et al. | |
| 2012/0031633 A1 | 2/2012 | Su et al. | |
| 2012/0305356 A1 | 12/2012 | Sato | |
| 2013/0000226 A1* | 1/2013 | Sugita | 52/167.7 |
| 2013/0180187 A1* | 7/2013 | Takeshita et al. | 52/167.8 |
| 2014/0090581 A1* | 4/2014 | Schultz | 108/57.12 |

OTHER PUBLICATIONS

U.S. Appl. No. 13/625,519, filed Sep. 24, 2012, Brock Robert Gardner.

U.S. Appl. No. 13/625,514, filed Sep. 24, 2012, Michael P. Czamara et al.

* cited by examiner

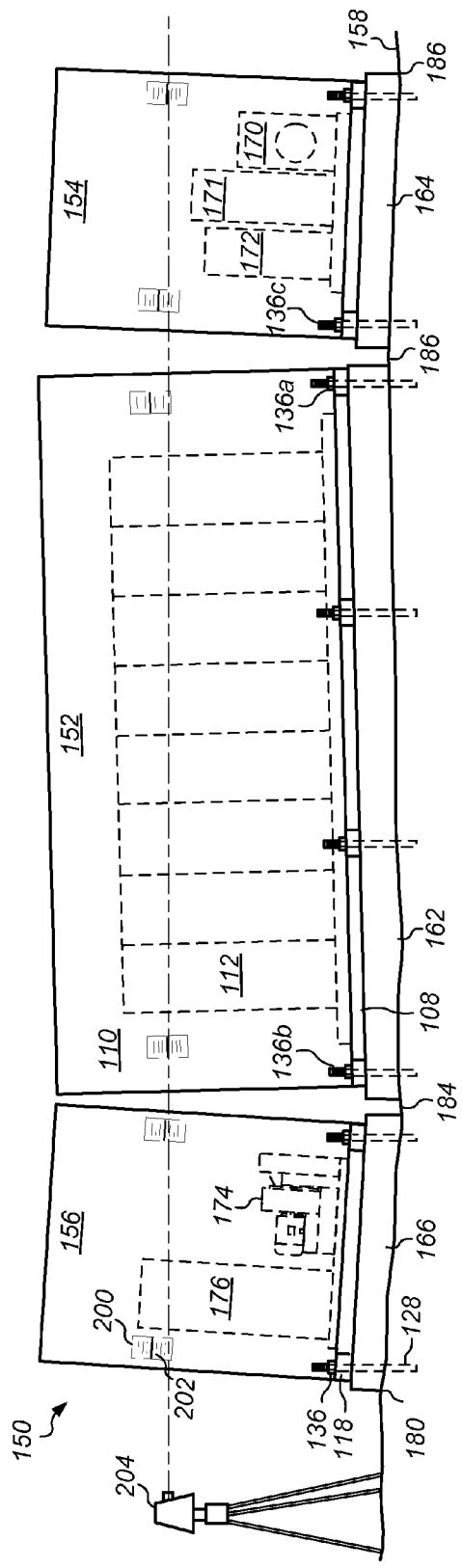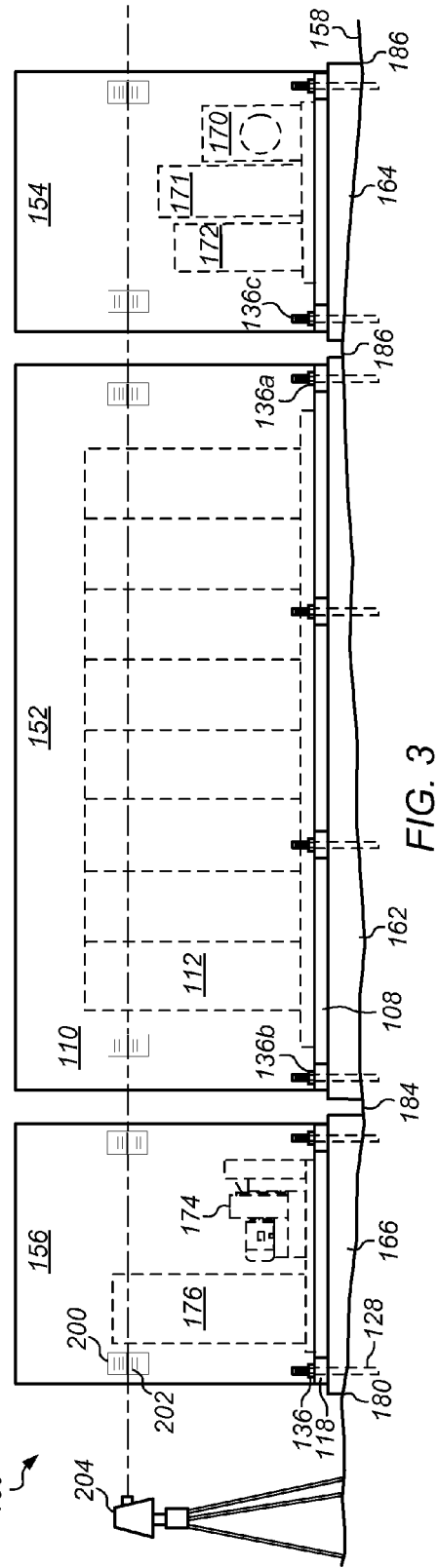

DATA CENTER MODULE WITH LEVELING PAD

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

Many data center includes numerous rack-mounted servers housed in a building. Such buildings may require a substantial investment in the form of construction costs, maintenance costs, and/or leasing costs. In addition, substantial time and resources are typically required to design and build a data center (or expansion thereof), lay cables, install racks and cooling systems. Additional time and resources are typically needed to conduct inspections and obtain certifications and approvals, such as for electrical and HVAC systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect.

Additional computing resources for a data center are sometimes provided in the form of racks or rack modules placed on a concrete floor of a building. In many cases, the surface of the concrete floor is not level or flat. The slope of a data center may be such that there are several inches of difference in elevation from one point on the floor of a data center to another. As a result, computing devices in the racks may lack stability, and thus be more susceptible adverse environmental conditions, such as vibration from air handling system blowers or other mechanical components.

From time to time, computing resources in data centers encounter adverse environmental conditions, such as earthquakes, floods, and fire. Vibration loads from an earthquake, for example, may cause substantial damages to rack computing systems.

BRIEF DESCRIPTION OF THE DRAWINGS

FIG. 2 is an elevation view of one embodiment of a data center with modules mounted on pads with leveling pad compression mechanisms.

FIG. 3 illustrates a data center after pad compression mechanisms have been operated to level modules in a data center.

Figure 1:
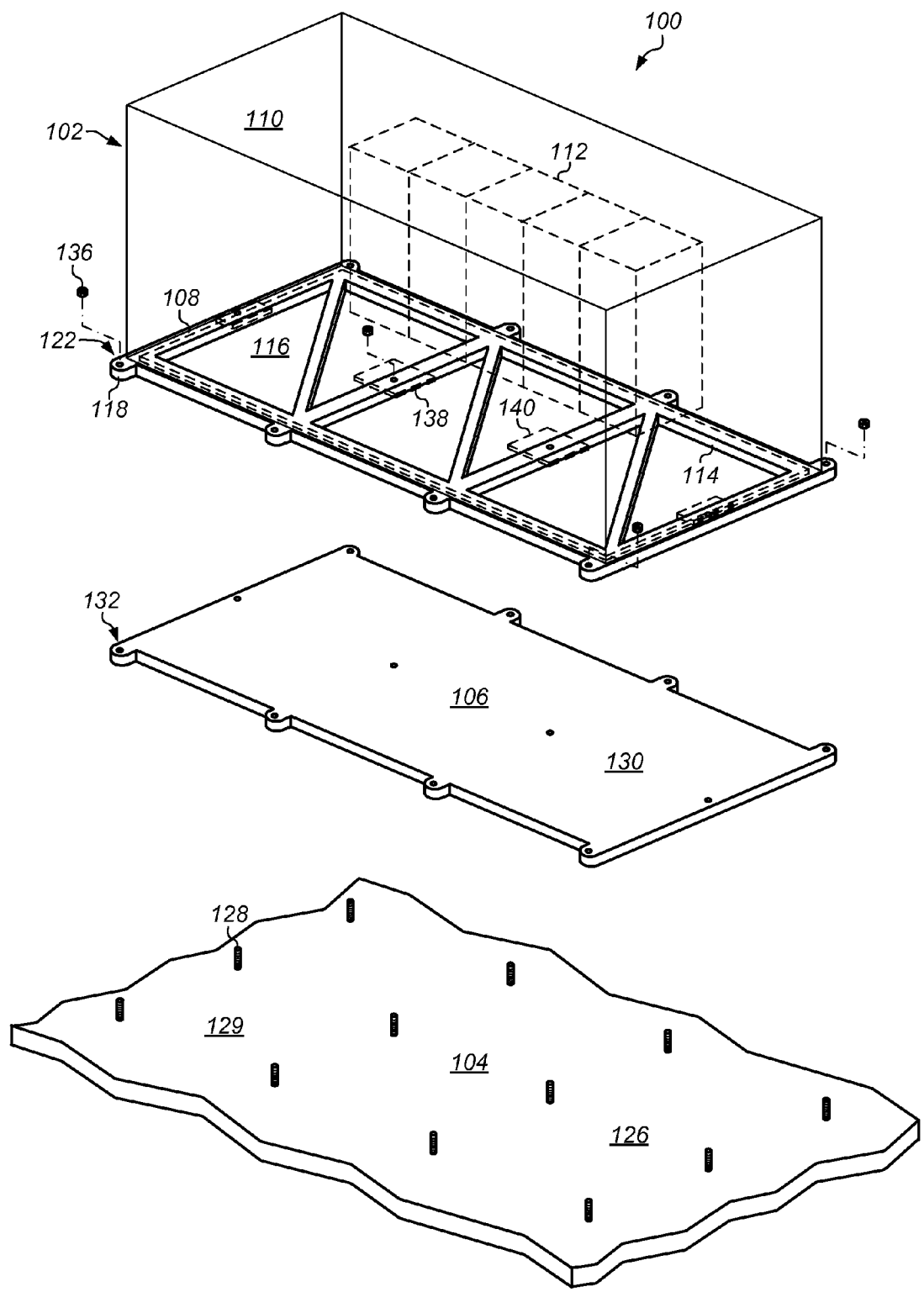
FIG. 1 is a partially exploded view illustrating one embodiment of a system including a data center module installed on leveling pad.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing computing resources are disclosed. According to one embodiment, a data center includes a computer room having a floor, one or more data center modules, and one or more pads between a module base of the data center modules and the floor. The data center modules include more rack computing systems coupled to the module base. The pads compress to conform to variations in the surface of the floor.

According to one embodiment, a system includes one or more modules, one or more pads between a base of the modules and a floor, and one or more pad compression mechanisms. The data center modules include more electrical systems coupled to the module base. The pads compress to conform to variations in the surface of the floor. The pad compression mechanisms are operable by a user to compress the pads between the modules and the floor.

According to one embodiment, a pad includes a body that can support a data center module. The body is compressible and conforms to variations in the surface of a floor. The body includes openings configured to receive one or more compression mechanisms.

According to one embodiment, a method of providing computing resources for a data center includes placing one or more pads on a floor of a site at a data center. One or more modules having rack computing systems are placed on the pads. The pads compress to conform to variations in the surface of the floor. A compression load is applied at one or more locations on the pads to change the elevation of one or more of the modules.

As used herein, "air handling module" means a module that provides air to one or more systems or components external to the module.

As used herein, an "aisle" means a space next to one or more racks.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, a "cable" includes any cable, conduit, or line that carries one or more conductors and that is flexible over at least a portion of its length. A cable may include a connector portion, such as a plug, at one or more of its ends.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "data center module" means a module that includes, or is suitable for housing and/or physically supporting, one or more computer systems that can provide computing resources for a data center.

As used herein, "elastomeric material" means a material that is primarily made of an elastomer. Elastomers include, for example, synthetic rubber and natural rubber. Examples of elastomers include polychloroprene rubber, silicone rubber, fluoroelastomer, and polybutadiene.

As used herein, "electrical module" means a module that distributes electrical power to systems or components external to the electrical module.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "power distribution unit" refers to any device, module, component, or a combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, "primary power" means any power that can be supplied to an electrical load, for example, during normal operating conditions.

As used herein, "rack computing systems" means a computing system that includes one or more computing devices mounted in a rack.

As used herein, "reserve power" means power that can be supplied to an electrical load upon the failure of, or as a substitute for, primary power to the load.

As used herein, "room" means a room or a space of a building. As used herein, "computer room" means a room of a building in which computing devices, such as rack-mounted servers, are operated.

As used herein, "seismic activity" means an event or series of events that result in release of energy from the Earth. The release of energy may be in the form of seismic waves.

As used herein, a "seismic load" is a load on a structure caused by acceleration induced on its mass by seismic activity, such as an earthquake, tremor, or temblor.

As used herein, a "space" means a space, area or volume.

In some embodiments, a system includes a module mounted on a pad. The pad may be resilient (for example, made of an elastomeric material). The module may include a module base and electrical systems mounted on the module base. Pad compression mechanisms may be operated by a user to compress the pads between the modules and the floor. The user may compress different locations in the pad by different amounts. By compressing the pad by different amounts, the user may level the module to compensate for non-levelness in the floor (for example, a slope in a concrete slab) on which the module is placed.

FIG. 1 is a partially exploded view illustrating one embodiment of a system including a data center module installed on leveling pad. System 100 includes data center module 102, floor 104, and pad 106. System 100 may be included in a data center. Data center module 102 is supported on floor 104 by way of pad 106.

Data center module 102 includes module base 108, enclosure 110, and rack computing systems 112. Module base 108 includes frame 114, module floor 116, and tabs 118. Rack computing systems 112 may include servers and other systems and devices for performing computing operations in data center module 102.

Mounting tabs 118 include mounting holes 122. In some embodiments, tabs 118 are eye plates or eye straps. The eye plates or eye straps may be used for lifting and moving data center module 102 (for example, transporting the module to the site with a crane).

Floor 104 includes slab 126 and threaded studs 128. Slab 126 includes upper surface 129. In one embodiment, slab 126 is concrete.

Pad 106 includes body 130 and holes 132. In one embodiment, pad 106 is at least one inch in thickness. In certain embodiments, pad 106 is an elastomeric pad that is not more than 12 inches in thickness. In one embodiment, pad 106 is at least 1 inch thick. In one embodiment, pad 106 is an elastomeric pad between 6 and 12 inches in thickness. In still another embodiment, pad 106 is an elastomeric pad between 3 and 6 inches in thickness.

In some embodiments, a resilient pad is compressed by a user at compression joints at one or more locations across the module to compensate for non-levelness (for example, sloping), lack of flatness (for example, dips or swells) in the floor on which the module installed.

Compression nuts 136 may be installed on threaded studs 128 to form compression joints. Compression nuts 136, threaded studs 128, and mounting tabs 118 of module base 108 and may serve as compression mechanisms for mounting of data center module 104. Compression joints may be distributed across data center module 102. Compression joints may be selectively used to level data center module 102.

Compression nuts 136 may turned on threaded studs 128 to compress pad 106 between module base 108 and floor 104. Compression nuts 136 at each location on pad 106 may be turned a different amount. In some embodiments, different compression mechanisms are turned by different amounts to achieve leveling of data center module 102 in system 100. For example, the compression nuts 136 on the left side of data center module 102 may be turned more than the compression nuts 136 on the right side of data center module 102 to lower data center module 102 by a greater amount on the left side of pad 106 than on the right side of the data center module.

Interior compression joints 138 may be accessed through hatches 140 in module floor 116. Hatches 140 may be removable panels.

In some embodiments, a pad under a data center module mitigates the effects of external loads on a module. A pad under a module may, for example, provide vibration isolation of computing devices from mechanical systems in a data center, such as blowers. A pad under a module may also provide isolation from activities in the data center, such as installation of other data center modules.

In certain embodiments, a compressed pad under a module may stabilize a rack under seismic load conditions. The compressed pad may provide vibration isolation for the module, and racks and computing devices in the module. In some embodiments, a compressed pad under a module reduces displacement in computing devices in the module under seismic loads.

In the embodiment shown in FIG. 1, system 100 includes a 3 by 4 array of pad compression joints. A system may, however, in various embodiments, include any number of exterior and interior pad compression joints.

In some embodiments, each module on the floor of a data center is mounted on its own pad. FIG. 2 is an elevation view of one embodiment of a data center with modules mounted on pads with leveling pad compression mechanisms. System 150 includes data center module 152, electrical module 154, air handling module 156, and floor 158. Data center module 152, electrical module 154, air handling module 156 are installed on floor 158. Pad 162 is between data center module 152 and floor 158. Pad 164 is between electrical module 154 and floor 158. Pad 166 is between air handling module 156 and floor 158.

Data center module 152 includes module base 108, enclosure 110, and rack computing systems 112. Rack computing systems 112 may include servers and other systems and devices for performing computing operations in data center module 152.

Electrical module 154 may include systems for providing electrical power to systems in data center modules 152. Electrical module 154 includes generator 170, switchgear/mechanical distribution panel 171 and uninterruptible power supply (UPS) 172.

Figure 4:
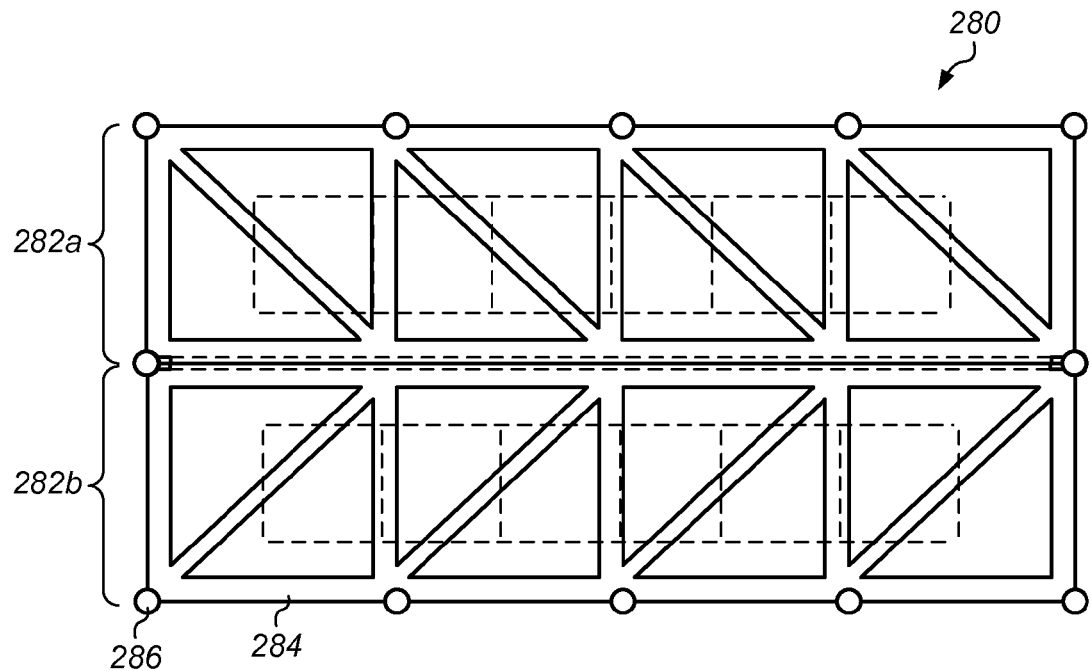
FIG. 4 illustrates a top view of a data center with modules mounted on leveling pad.

Electrical module 154 may be coupled to an external source of electrical power, such as a utility feed. Electrical module 154 may distribute electrical power to data center module 152. Although only one UPS is shown in FIG. 4, an electrical module may in some embodiments have more than UPS (for example, 5 UPSs). In certain embodiments, an electrical module for a module computing system may have no UPS. Service access to the components of electrical module may be through electrical module access doors 128.

Electrical module 154 may house all of the electrical gear associated with the modular computing system. In one embodiment, electrical module 154 includes an automatic transfer switch, 2 UPSs at 550 k W each, and distribution panel panels. In some embodiments, electrical power at 480/277Y voltage is distributed to racks in data center modules.

Air handling module 156 may supply air to data center modules 152 for removing heat from heat producing components in data center module 152. Air handling module 156 includes blower 174 and heat removal unit 176. Heat removal unit 176 may include variable frequency drives (VFDs). The VFDS may be coupled to blower 174. VFDs 121 may be coupled to a control system for use in controlling blower 174.

Cooling air for heat producing components of data center module 152 and electrical module 154, including but not limited to uninterruptible power supply 172, may be provided by air handling module 156.

In some embodiments, data center module 152, electrical module 154, air handling module 156 are prefabricated modules. Each data center module 152, electrical module 154, and air handling module 156 may be separately transported to a site. For example, each of the modules or half modules may be transportable on a semi-trailer. In certain embodiments, a data center module includes two half modules that are coupled to one another at the site to form the data center module. In one embodiment, each of the half modules of a data center module is supported on a separate pad.

In some embodiments, pads for different modules may have different thicknesses, material properties, or both. Examples of material properties of a pad that can be controlled or selected include hardness, density, and modulus of elasticity For example, for a module with a relatively high weight per unit area of footprint, a relatively high density, a relatively high modulus of elasticity, or both, may be selected. For a module with a relatively low weight per unit area of footprint, a relatively low density, a relatively low modulus of elasticity, or both, may be selected. In certain embodiments, the thickness of a pad for a module is selected based on the weight per unit area of the module. For example, for a module with a relatively high weight per unit area of footprint, a relatively thick pad may be selected.

As illustrated in FIG. 2, the floor on which modules are mounted may deviate from levelness, flatness, or both. For example, point 180 and 182 are at a higher elevation than point 184 and point 186. In addition, the surface of floor 158 deviates from a flat surface (for illustrative purposes, both the deviations from flatness and the deviations from levelness may be exaggerated in FIGS. 2 and 3). The deviations from flatness and levelness may occur in multiple directions on the floor (for example, x and y directions). As such, as initially installed, data center module 152, electrical module 154, air handling module 156 may deviate from level (for example, lean to one side or another).

In some embodiments, compression mechanisms are operated by a user to compensate from deviations from levelness and/or flatness in a floor. In the system shown in FIG. 2, compression nuts 136, threaded studs 128, and mounting tabs 118 of module base 108 may serve as compression mechanisms for mounting of data center module 152. For example, the compression nut 136a on the right side of data center module 152 may be turned more than the compression nut 136b on the left side of data center module 102 to lower data center module 152 by a greater amount on the right side of data center module 152 than on the left side of the module.

In FIG. 2, only one of each of a data center module, an electrical module, and an air handling module are shown for illustrative purposes. A computing system may nevertheless, in various embodiments include any number of data center modules, electrical modules, and air handling modules. In one embodiment, two or more data center modules are installed between one electrical module and one air handling module.

In some embodiments, an instrument is used to determine adjustments to be applied at each of the compression joints of a pad. In FIG. 2, data center module 152, electrical module 154, and air handling module 156 include level markers 200. Level markers 200 include scale 202. Instrument 204 may be used to assess the elevation of various locations on data center module 152, electrical module 154, and air handling module 156. For example, a marker may be sited in each of the four corners for each of the modules to be leveled. In certain embodiments, instrument is aligned relative to a lever marker for each of the compression joints for a module.

Instruments for determining compression pad adjustments may be of any type. In one embodiment, instrument 204 is a laser level. In certain embodiments, instrument sensors are provided in multiple locations around a set of modules to be leveled. For example, one laser level may be located off the northwest corner of a set of modules and a second laser level may be located off the southeast corner of the set of modules. In some embodiments, information from sensors in two or more locations is provided to a module level assessment system. The module level assessment system may include, in one embodiment, a programmable logic controller. The module level assessment system may compute adjustments to be applied to each compression joint. In some embodiments, level sensors may provide feedback the module level assessment system as the compression mechanisms are operated to update information for adjusting the level at various locations of the module.

FIG. 3 illustrates a data center after pad compression mechanisms have been operated to level modules in a data center. Once the needed adjustments in elevation have been determined for each of the locations on the module, compression mechanisms may be operated to level data center module 152, electrical module 154, and air handling module 156. For example, compression nuts 136a and 136c may be turned to compress pads 162 and 164 near point 186 to lower elevation data center module 152 and air handling module 156 near point 186.

In FIGS. 2 and 3, adjustments to achieve level modules are shown for illustrative purposes to address deviations in one direction (deviations from left to right). Adjustments to a pad may, nevertheless in various embodiments be made in more than one direction. For example, pads may be compressed to achieve levelness in along the length and along the depth of a module.

FIG. 4 illustrates a top view of a data center with modules mounted on leveling pad. System 280 includes pad 282a and 282b. Pad 282a and 282b may each support a data center module with one or more rows of rack computing systems (a row of rack computing systems of a data center module are shown in dashed lines for illustrative purposes).

Pad 282a and 282b include interconnecting segments 284 and joint nodes 286. Each of joint nodes 286 may receive, or couple to, a compression mechanism, such as described above relative to FIG. 1. In some embodiments, interconnecting segments 286 correspond to members of a frame of a module to be installed on the pad.

In some embodiments, different sections of a pad may have different thicknesses or material properties than other parts of a pad. The differences in thickness or material properties may correspond to characteristics of the module to be installed on the pad. For example, if the weight of an electrical module is concentrated in the middle of the electrical module, a pad for the module may have a denser material in the middle than along the perimeter of the pad.

Figure 5:
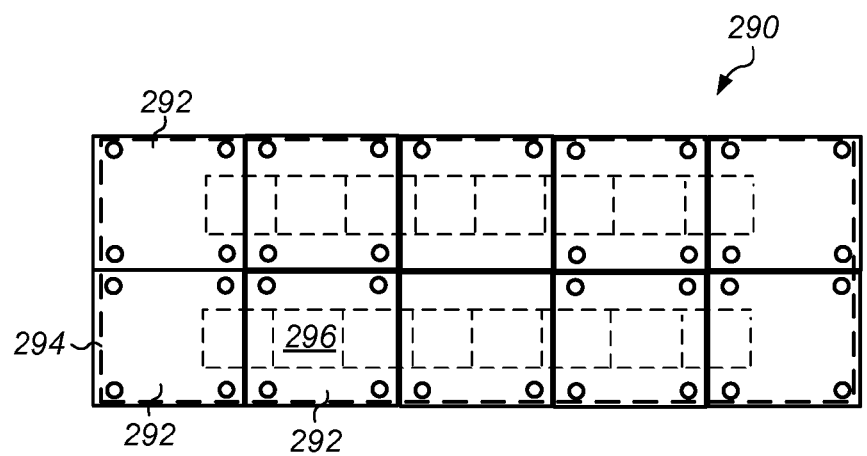
FIG. 5 illustrates one embodiment of a data center module supported on multiple pads.

In some embodiments, a set of two or more pads supports a module on the floor of a data center. FIG. 5 is a schematic diagram illustrating one embodiment of a data center module supported on multiple pads. System 290 includes an array of pads 292. Pads 292 may be compressible, such as the pads described above relative to FIG. 1. Pads 292 support data center module 294. Data center module 294 holds rack computing systems 296. Compression mechanisms 298 may be operated to change a adjust the level of data center module 294 at different locations across the length and width of the module.

In the embodiment shown in FIG. 5, pads 296 supporting data center module 294 are in a 5 by 2 array. A set of pads for a module may, however, in various embodiments, a systems for supporting a module include any number of pads. Adjacent pads may be stacked or linked in linear fashion to match the footprint of the module. In one embodiment, a set of 5 by 5 pads in a 7 by 3 array support of a data center module about 40 feet long by about 10 feet long.

The durometer and thickness of pads for a module may vary from module to module. The thickness of a pad, in some embodiments, is at least 3 inches thick. The durometer of the pads may have a Shore D hardness rating of at least 55. In one embodiment, pads for a module are made of rubber having a thickness of between 3 to 6 inches in depth and a Shore D rating between 55 and 70. In certain embodiments, a pad includes foam rubber.

In some embodiments, computing systems, electrical power supply systems, and cooling components are provided in the same module. For example, in the system shown in FIG. 5, cooling components (for example, an air handling unit), electrical components (for example, a UPS), may be commonly housed with rack computing systems 296 in data center module 294. In some embodiments, electrical power distribution components and/or cooling system components are housed in separate compartments in a module from the rack computing systems and/or from one another.

In some embodiments, modules with components that produce vibration in a facility are supported on compressible pads. The pads may isolate the vibration-producing components from other systems in the facility, including computing devices. For example, in the system shown in FIGS. 2 and 3, pad 166 may isolate vibration produced by blower 174 from computing devices in rack computing systems 112. In certain embodiments, one or more vibration-producing components are separately installed on a pad. In one embodiment, a generator in a module is isolated by a pad. Examples of other vibration producing components that can be isolated by pads under a module in various embodiments include pumps, generators, and air handling units.

Figure 6:
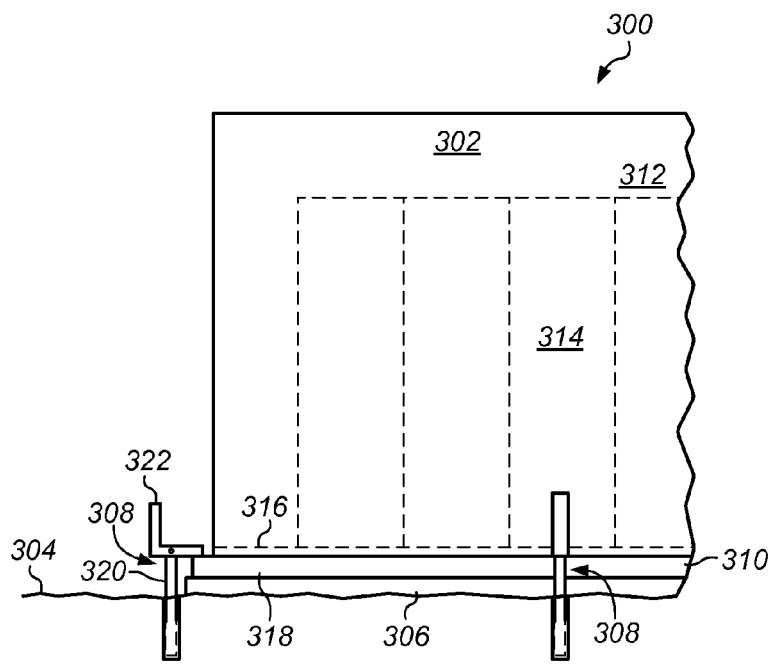
FIG. 6 illustrates one embodiment of compression mechanism that engages on a rim of a module in a data center.

FIG. 6 illustrates one embodiment of compression mechanism that engages on a rim of a module in a data center. System 300 includes data center module 302, floor 304, pad 306, and compression mechanism 308. Data center module 302 includes module base 310, enclosure 312, and rack computing systems 314. Module base 310 includes module floor 316 and rim 318.

Each of compression mechanisms 308 includes threaded rod 320 and locking lever 322. Threaded rod 320 includes may be engaged in threaded sockets 324 in floor 304. Locking levers 322 may be engaged on rim 318 of module base 310. Each of locking levers 322 may be adjustable to control an amount of compression on pad 306 at the location of the compression mechanism.

In the embodiment shown in FIG. 6, compression mechanisms 308 are shown for illustrative purposes installed in threaded sockets in the floor. A mechanism for compressing a pad under a module may, nevertheless, in various embodiments be secured to the floor by other arrangements. Examples of other connections include a hook connected in a channel or socket, a tongue-and-groove connection, or a clamp. In certain embodiments, a floor may include a rail connected to a slab to which a compression mechanism can be mounted.

In the embodiment shown in FIG. 6, compression mechanisms 308 are shown for illustrative purposes as having a locking lever for exerting a compressive force on the pad. A mechanism for compressing a pad under a module may, nevertheless, in various embodiments exert a load by way of other devices. Examples of other mechanisms include cam-lock or a threaded knob.

Although compression mechanisms 308 are shown around the edges of data center module 302, compression mechanisms may, in some embodiments, be included in the interior of data center module 302. In some embodiments, interior compression mechanisms are accessed by way of a hatch in the floor of the data center module.

Figure 7:
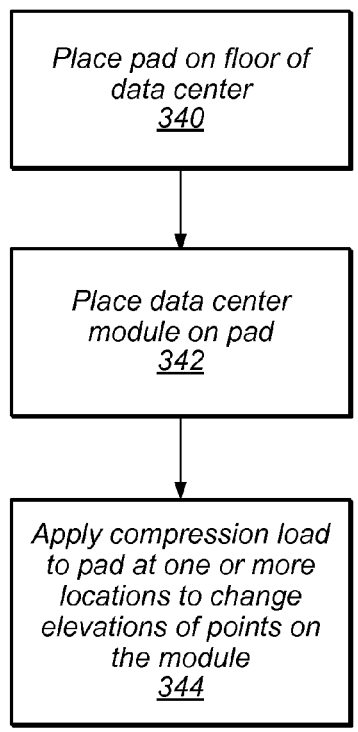
FIG. 7 illustrates one embodiment of providing computing resources that includes compressing pads under a module.

FIG. 7 illustrates one embodiment of providing computing resources that includes compressing pads under a module. At 340, a pad is placed on the floor of a site at a data center. The pad may be an elastomeric pad. In some embodiments, the pad includes holes for threaded studs on the floor.

At 342, a data center module is placed on the pad. When the data center module is placed on the pad, the pad may compress under the weight of the module. The pad may conform to variations in the surface of the floor. In cases where the floor is not level, the data center module may also be out of level as initially installed (for example, leaning or canted).

At 344, a compression load is applied to the pad at one or more locations to change the elevation of the pad. In some embodiments, the elevations of points on the module are measured to assess the deviation of module from level as initially installed on the pad. A compression adjustment to be applied to the pad at the location of each compression mechanism may be computed from the measurements. Adjustments may be performed to bring the module into level with acceptable tolerances.

In various embodiments described above, a compression load is applied to the module that is installed on the pad (for example, applied to tabs 118 of data center module 102.). A compression load on a pad may, nevertheless, in some embodiments, be applied independent of the structure of the module being installed on the pad. For example, a compression lever may engage on a pad bye direct contact with the pad. As another example, a compression mechanism may apply a load via an intermediate member that is separate from the module, such as a rod or bar.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
a computer room comprising a floor;
one or more data center modules, wherein at least one of the one or more data center modules comprises:
a module base; and
one or more rack computing systems coupled to the module base;
one or more pads between the module base of the at least one data center module and the floor; and
a plurality of pad compression mechanisms coupled to the floor;
wherein the pad is configured to compress to at least partially conform to variations in a surface of the floor;
wherein the plurality of pad compression mechanisms comprise a first pad compression mechanism coupled to the floor at a first location and a second pad compression mechanism coupled to the floor at a second location, wherein the surface of the floor at the first location is at a different elevation than the surface of the floor at the second location;
wherein the module base is configured to transmit a given compressive force exerted on the module base by the first pad compression mechanism and to transmit another compressive force exerted on the module base by the second pad compression mechanism such that the module base compresses the pad at the first location by a given amount and compresses the pad at the second location by another amount, such that a level of the at least one data center module is adjusted.

2. The data center of claim 1, wherein at least one of the one or more pads comprises an elastomeric material.

3. The data center of claim 1, wherein at least one of the one or more pads is at least 3 inches thick and has a Shore D hardness of at least 55.

4. The data center of claim 1, wherein at least one of the plurality of pad compression mechanisms is adjustable to compress at least one of the one or more pads.

5. The data center of claim 1, wherein the plurality of pad compression mechanisms comprises at least three pad compression mechanisms, wherein the at least three pad compression mechanisms are coupled to the floor in an arrangement such that the at least three pad compression mechanisms are configured to adjust a level of the data center module in more than one direction.

6. A system, comprising:
one or more modules comprising:
a module base; and
one or more electrical systems coupled to the module base; and
one or more pads between the module base of at least one of the modules and a floor, wherein at least one of the pads is configured to compress to at least partially conform to variations in a surface of the floor; and
a plurality of pad compression mechanisms adjustable to compress at least one of the one or more pads between at least one of the modules and the floor
wherein the plurality of pad compression mechanisms comprise a first pad compression mechanism configured to couple to the floor at a first location and a second pad compression mechanism configured to couple to the floor at a second location, wherein the surface of the floor at the first location is at a different elevation than the surface of the floor at the second location;
wherein the module base of the at least one module is configured to transmit a given compressive force exerted on the module base by the first pad compression mechanism and to transmit another compressive force exerted on the module base by the second pad compression mechanism such that the module base compresses the pad at the first location by a given amount and compresses the pad at the second location by another amount, such that a level of the at least one module is adjusted.

7. The system of claim 6, wherein at least one of the one or more pads is compressible under the weight of at least one of the modules.

8. The system of claim 6, wherein at least one of the one or more pads comprises an elastomeric material.

9. The system of claim 6, wherein, the plurality of pad compression mechanisms comprises at least three pad compression mechanisms, wherein the at least three pad compression mechanisms are coupled to the floor in an arrangement such that the at least three pad compression mechanisms are configured to adjust a level of the at least one module in more than one direction.

10. The system of claim 6, wherein at least one of the pad compression mechanisms is adjustable to at least partially conform at least one of the one or more pads to flatness variations in the surface of the floor.

11. The system of claim 6, wherein the floor comprises a plurality of threaded studs extending from the surface of the floor, wherein at least one of the one or more pad compression mechanisms comprises a threaded coupler configured to engage on at least one of the threaded studs of the floor.

12. The system of claim 6, wherein at least one of the modules comprises a module floor, wherein at least one of the one or more pad compression mechanisms is accessible through the module floor.

13. The system of claim 6, wherein at least one of the module bases comprises a frame comprising a plurality of frame members, wherein at least one of the one or more pads comprises one or more sections that correspond to frame members of the at least one module base.

14. The system of claim 6, wherein the pad is configured to reduce displacement of at least some of the electrical systems in at least one of the modules from vibration loads transmitted from the floor to the at least one module.

15. The system of claim 6, wherein the one or more modules comprise two or more modules, wherein the one or more pads comprise a first pad under a first one of the modules and a second pad under a second one of the modules.

16. The system of claim 6, wherein the one or more modules comprise two or more modules, wherein the one or more pads comprise a first pad under a first one of the modules and a second pad under a second one of the modules, wherein the first pad has a different thickness or different material properties from the second pad.

17. The system of claim 6, wherein at least one of the one or more pads has a thickness of at least one inch.

18. The system of claim 6, wherein at least one of the one or more pads comprises a first section and a second section, wherein the first section of the at least one pad and the second section of the at least one pad have different material properties or a different thickness from one another.

19. The system of claim 6, wherein at least one of the modules is a data center module, wherein the data center module comprises one or more rack computing systems coupled to the module base.

20. The system of claim 6, wherein at least one of the modules is an electrical module, wherein the electrical module comprises one or more power distribution components configured to supply power to loads external to the electrical module.

21. The system of claim 6, wherein at least one of the modules comprises a generator, wherein the at least one of the one or more pads is configured to isolate vibration produced by the generator from at least one of the rack computing systems.

22. The system of claim 6, wherein at least one of the modules is a cooling module configured to supply air to cool heat producing components external to the module.

23. A pad, comprising:
   a body configured to support a data center module, wherein at least a portion of the body is compressible and configured to at least partially conform to variations in the surface of a floor; and
   a plurality of openings configured to receive a plurality of compression mechanisms, wherein the plurality of openings comprise openings aligned in a first line and openings aligned in at least one additional line,
   wherein the body is configured to compress respective amounts due to respective compressive forces exerted on the body by each of at least three respective compression mechanisms of the plurality of compression mechanisms, wherein each compression mechanism of the at least three compression mechanisms is received at a respective opening of the plurality of openings, such that a level of a surface of the pad is adjustable in more than one direction.

24. The pad of claim 23, wherein at least one of the pads comprises an elastomeric material.

25. The pad of claim 23, wherein at least one of the one or more pads is between 3 inches and 6 inches thick.

26. The pad of claim 23, wherein the pad comprises one or more sections that correspond to frame members of a base of the data center module.

27. A method, comprising: placing one or more pads on a floor of a site at a data center, wherein the one or more pads are configured to compress and conform to variations in a surface of the floor; placing a module base on the one or more pads on the floor; placing one or more modules comprising one or more rack computing systems on the module base; adjusting a first compression mechanism coupled to the floor to apply a compression load to the module base at a first location on at least one of the pads; and adjusting a second compression mechanism coupled to the floor to apply a different compression load to the module base at a second location on the at least one pad, wherein the surface of the floor at the second location is at a different elevation than the surface of the floor at the first location; wherein adjusting the first compression mechanism and adjusting the second compression mechanism compress the at least one pad at the first location by a given amount and compress the at least one pad at the second location by another amount to cause a level of at least one of the modules to be adjusted.

28. The method of claim 27, wherein each of at least two of the pads is selected based on the weight of the module to be supported on the pad, wherein the pad for at least one of the modules has a different thickness or different material properties than at least one other of the pads.

* * * * *